United States Patent [19]
Sorimachi et al.

[11] Patent Number: 6,135,102
[45] Date of Patent: Oct. 24, 2000

[54] WAFER COLLECTING APPARATUS

[75] Inventors: Mitsuo Sorimachi; Kenichi Nakaura, both of Mitaka, Japan

[73] Assignee: Tokyo Seimitsu Co., Ltd., Mitaka, Japan

[21] Appl. No.: 09/193,710

[22] Filed: Nov. 17, 1998

[51] Int. Cl.[7] ............................................. B28D 1/08
[52] U.S. Cl. .......................... 125/21; 125/16.02; 125/20
[58] Field of Search .................................. 125/12, 13.01, 125/16.02, 20, 21; 451/331, 336, 339, 5, 6; 414/940, 936, 935

[56] References Cited

U.S. PATENT DOCUMENTS

| | | | |
|---|---|---|---|
| 4,891,530 | 1/1990 | Hatji | 250/572 |
| 5,605,141 | 2/1997 | Bilotta | 125/16.02 |
| 5,715,807 | 2/1998 | Toyama et al. | 125/16.02 |
| 5,771,876 | 6/1998 | Egglhuber | 125/16.02 |
| 5,848,868 | 12/1998 | Suzuki et al. | 414/936 |

*Primary Examiner*—Derris H. Banks
*Attorney, Agent, or Firm*—Nixon Peabody LLP; David S. Safran

[57] ABSTRACT

A running bonded abrasive wire cuts wafers one by one from a slice base, which hold the wafers. The cut wafers are transported on the first conveyor to a collecting part. During the transport process, a CCD camera images the shape of the wafer, and outputs the image data of the wafer to a control unit. The control unit image-processes the image data to recognize whether the transported wafers are normal or inferior. In accordance with the recognition results, the collecting part collects the normal wafers and the inferior wafers separately.

18 Claims, 5 Drawing Sheets

WAFER COLLECTING APPARATUS

BACKGROUND OF THE INVENTION

1. Field of the Invention

The present invention relates generally to a wafer collecting apparatus, and more particularly to a wafer collecting apparatus which collects a number of wafers, which have been sliced at the same time by a wire saw, one by one from a slice base which holds the wafers.

2. Description of Related Art

Figure 5:
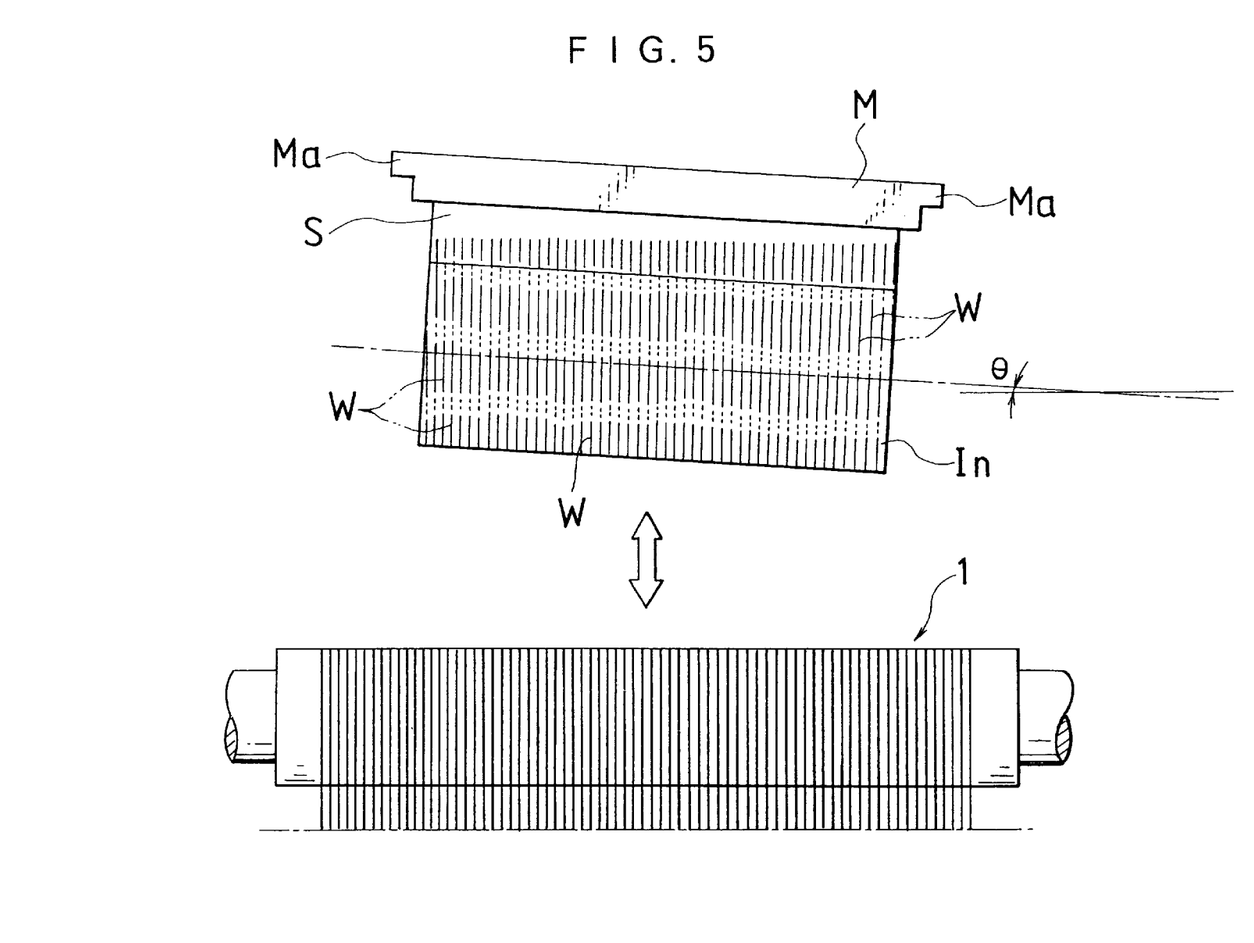
FIG. 5 is a view of assistance in explaining the state wherein a wire saw is slicing an ingot.

As shown in FIG. 5, when a wire saw 1 slices an ingot In which is made of silicon, etc. which is material for a semiconductor device, the ingot In is inclined at a predetermined angle θ with respect to a wire row so that the wafers W can be in a predetermined crystal orientation. Therefore, several wafers W at both ends of the ingot cannot be round. They may be crescent-shaped or chipped at the bottom end thereof.

A number of wafers W, which have been sliced at the same time, are held in a slice base S (batch wafers), and the wafers W are separated from the slice base to be individual wafers. A special separating machine is used to separate the wafer W from the slice base. Since the wafers which are not circular (inferior wafers) cannot be sold on the market, an operator needs to recognize the inferior wafers before the wafers W are set in the separating machine or after the wafers W are separated from the slice base S.

It is inefficient and unproductive because the operator has to recognize and remove the inferior wafers among the sliced wafers every time the ingot is sliced.

SUMMARY OF THE INVENTION

The present invention has been developed in view of the above-described circumstances, and has as its object the provision of a wafer collecting apparatus which automatically collects a number of wafers, which have been sliced at the same time, one by one from a slice base which holds the wafers, and automatically distinguishes between the normal wafers and the inferior wafers.

To achieve the above-mentioned object, the present invention is directed to a wafer collecting apparatus which collects a number of wafers, having been sliced from an ingot at the same time by a slicing machine, from a slice base holding the wafers, the wafer collecting apparatus comprising: holding means for holding a slice base with the wafers at the lower side thereof; a carriage which runs along the slice base held by the holding means; cutting means provided at the carriage to cut the slice base as the carriage runs and to cut off the wafers one by one from the slice base; transport means provided below the holding means for receiving the wafer, which is cut off from the slice base and falls onto the transport means, and transporting the received wafer; imaging means for imaging the shape of the wafer transported by the transport means; distinguishing means for distinguishing between normal wafers and inferior wafers in accordance with the imaging results of the imaging means; and collecting part for collecting the wafers transported by the transporting means.

According to the present invention, the cutting means cuts the slice base held by the holding means, and therefore, the wafers held by the slice base are cut off one by one from the slice base. The cut-off wafers fall and the transport means receives them. The transport means transports the wafers to the collecting part. During the transport process, the imaging means images the shape of the wafer, and the distinguishing means distinguishes between the normal wafers and the inferior wafers.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

This invention will be described in further detail by way of example with reference to the accompanying drawings.

Figure 1:
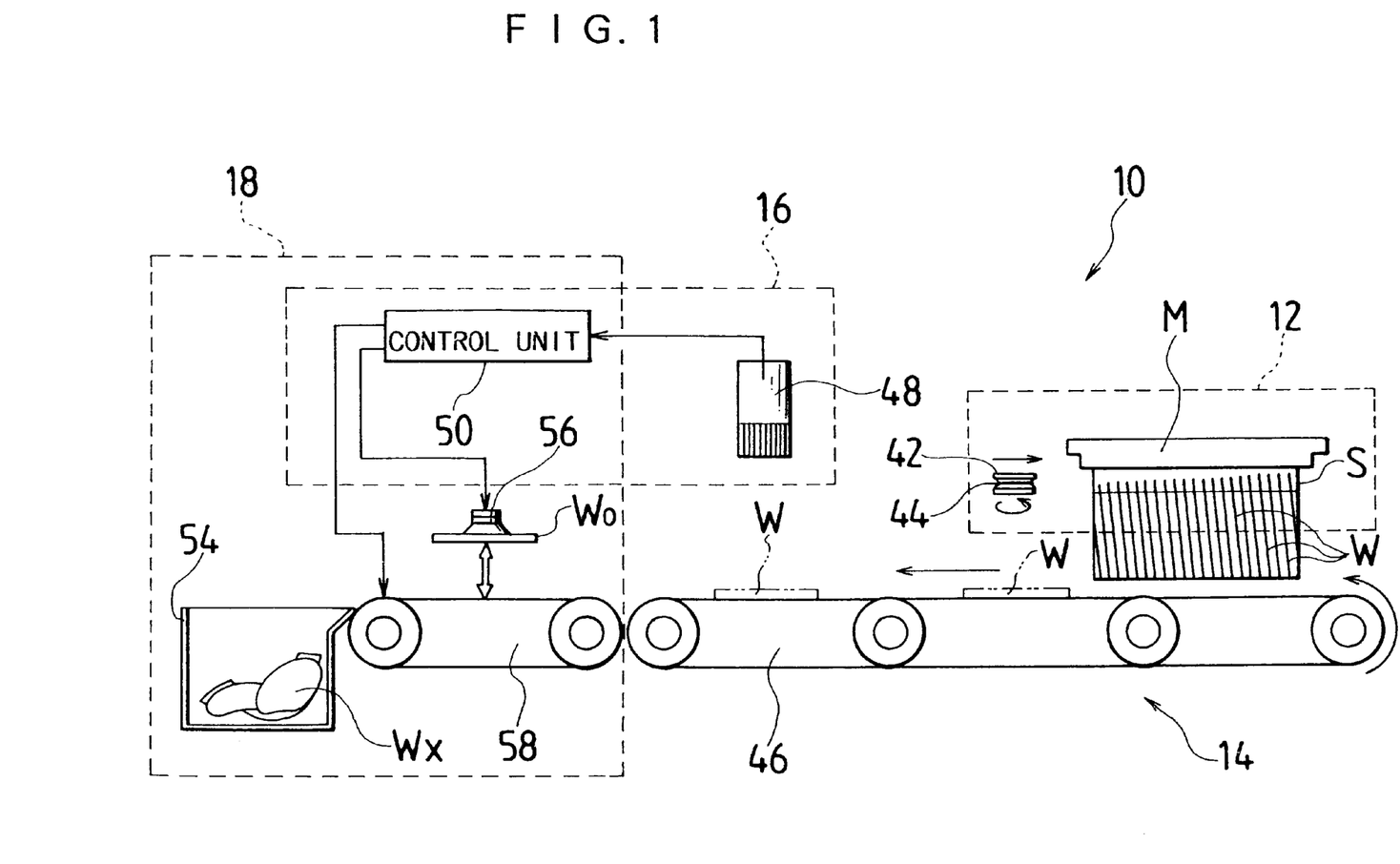
FIG. 1 shows the entire structure of an embodiment of a wafer collecting apparatus according to the present invention.

FIG. 1 shows the entire structure of a wafer collecting apparatus according to an embodiment of the present invention. As shown in FIG. 1, the wafer collecting apparatus 10 consists of a cutting part 12 which cuts wafers W from a slice base S one by one, a transporting part 14 which transports the cut-off wafers W, a distinguishing part 16 which images the shape of the wafer W transported on the transporting part 14 and distinguishes between the normal wafers and the inferior wafers, and a collecting part 18 which collects the wafers W transported by the transporting part 14.

Figure 2:
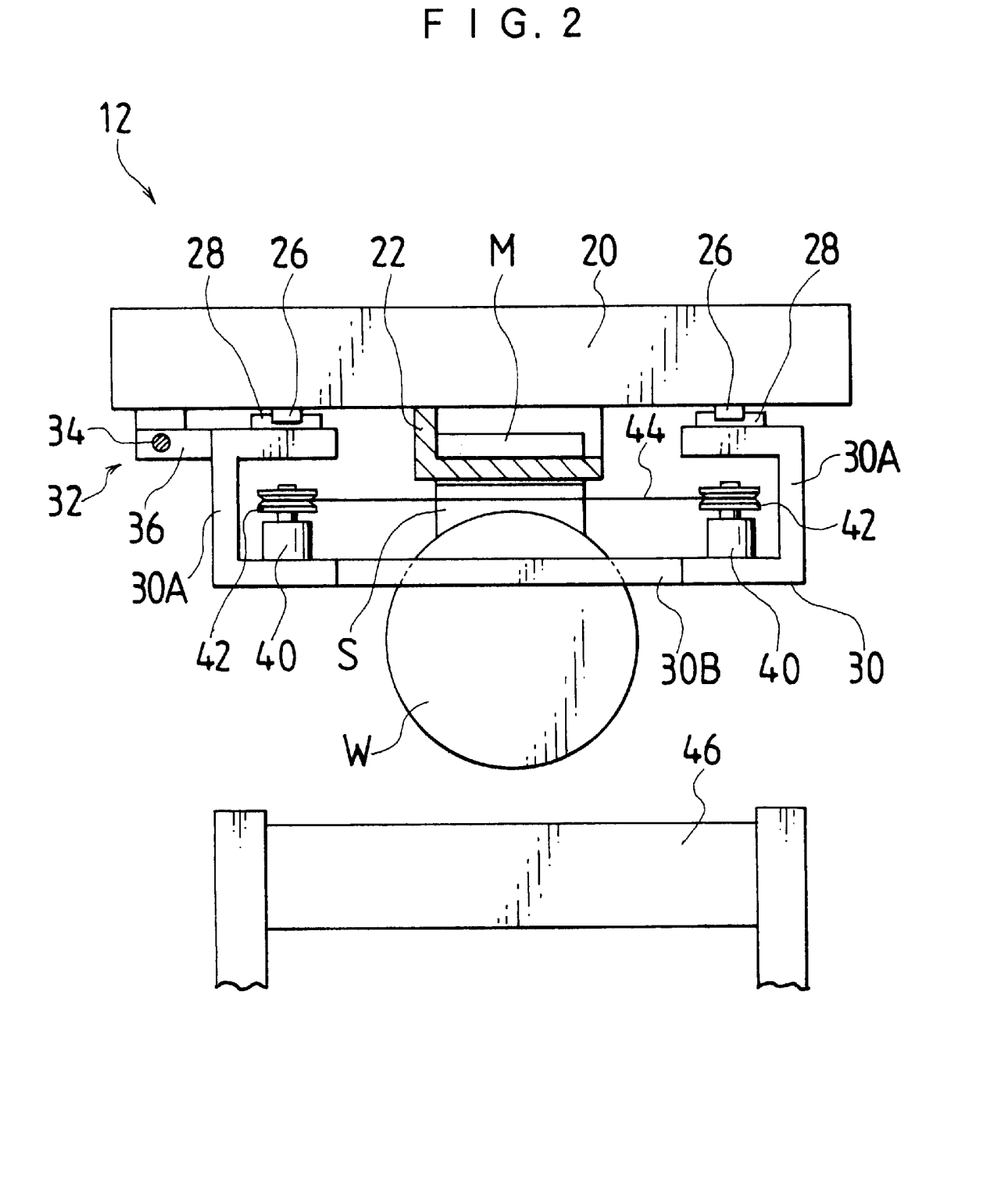
FIG. 2 is a front view illustrating the structure of a cutting part.
Figure 3:
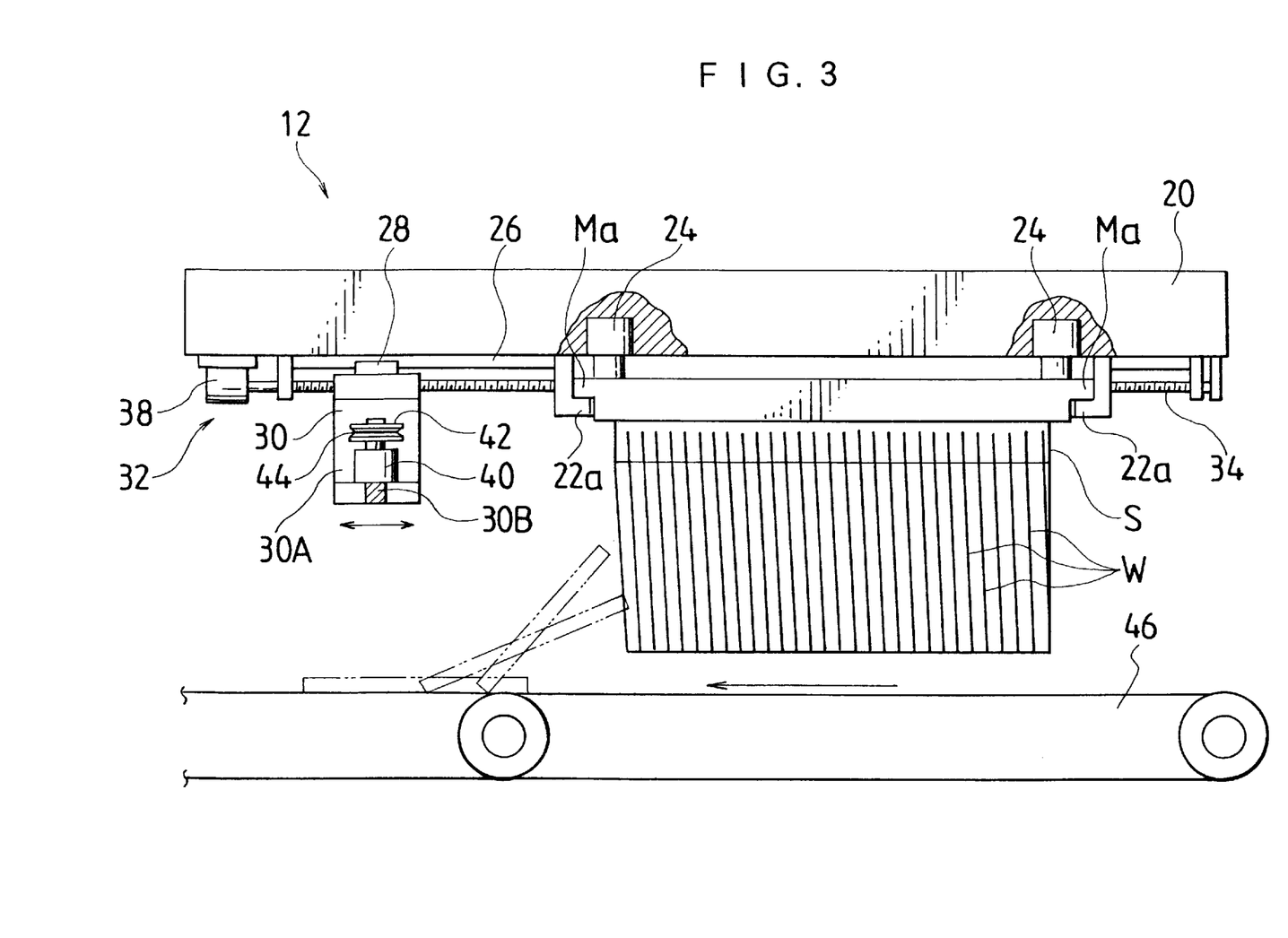
FIG. 3 is a side view illustrating the structure of the cutting part.

FIG. 2 is a front view illustrating the structure of the cutting part 12, and FIG. 3 is a side view thereof. As stated previously, the cutting part 12 cuts the wafers W, which are held by the slice base S like the teeth of a comb, one by one from the slice base S.

As shown in FIGS. 2 and 3, a wafer subject for cutting is attached to a setting unit 22, which is attached to the bottom of a base 20 that is held horizontally by a frame (not illustrated).

In this embodiment, a slicing machine such as a wire saw slices an ingot into a number of wafers W at the same time, and the wafer collecting apparatus 10 collects those wafers W. According to the slicing machine such as the wire saw, however, the ingot is normally mounted on the slicing machine through a special mounting member called a mounting plate M as shown in FIG. 5. After the slicing, the wafers W are picked out from the slicing machine with the mounting plate M. Thus, in the wafer collecting apparatus 10 of this embodiment, the wafers W are transported in a state of being mounted on the mounting plate M.

The mounting plate M is adhered to the top of the slice base S, which is adhered to the ingot In, and the mounting plate M is a rectangular plate to match the shape of the slice base S. Flanges Ma are formed at both ends of the mounting plate M, and a setting unit of the slicing machine holds the flanges Ma so that the mounting plate M can be mounted on the slicing machine. Likewise, the setting unit 22 of the wafer collecting apparatus 10 according to this embodiment holds the flanges Ma of the mounting plate M so that the wafer can be attached to the setting unit 22.

The setting unit 22 is a U-shaped frame, and projections 22a are formed at the lower part of both ends of the setting unit 22. Flanges Ma of the mounting plate M are coupled to the projections 22a. When the mounting plate M is coupled to the projecting parts 22a, it is held parallel to the base 20. A pair of hydraulic cylinders 24, which is built in the base 20, presses the top of the mounting plate M, and therefore, the mounting plate M can be fixed.

A pair of guide rails 26 are arranged parallel along the setting unit 22. A base 30 is slidably supported by a pair of guide rails 26 through sliders 28. The base 30 is constructed in such a way that two U-shaped carriages 30A, are connected to one another by a rod-shaped connecting frame 30B. When a feed unit 32 drives the base 30, the base 30 runs back and forth on the guide rail 26.

The feed unit 32 consists of a screw stock 34 that is rotatably supported along the guide rail 26A; a nut member 36 threaded with the screw stock 34; and a motor 38 that rotates the screw stock 34. The base 30 connects to the nut member 36. Running the motor 38 moves the nut member 36, which connects to the base 30, along the screw stock 34 and runs the base 30 along the guide rail 26.

Motors 40 are placed on the pair of carriages 30A in the base 30. Pulleys 42 are secured to spindles of the motors 40, and an endless bonded abrasive wire 44 is stretched between the pulleys 42.

The bonded abrasive wire 44 is formed by securing a number of abrasive grains to the periphery of a normal wire. The bonded abrasive wire 44, which is pressed against a workpiece, runs and cuts the workpiece. Running the motors 40 moves the bonded abrasive wire 44 that is stretched between the pulleys 42.

The pulleys 42 are set in such a way that the position of the stretched bonded abrasive wire 44 corresponds to the position of the slice base S of the wafer which is attached to the setting unit 22.

The cutting part 12 cuts the wafers W from the slice base S. Specifically, while the bonded abrasive wire 44 is running, the feed unit 32 is driven to run the base 30 toward the wafer W which is attached to the setting unit 22. The base 30 runs toward the wafer W, causing the bonded abrasive wire 44 to be pressed against the slice base S. Therefore, the slice base S is cut, and the wafer W is cut off from the slice base S. Since the base 30 runs along the slice base S, which is sequentially cut by the bonded abrasive wire 44, the wafers W are cut off from the slice base S one by one.

A description will be given of the structure of the transport part 14. As stated previously, the transport part 14 transports the wafers W, which have been cut off from the slice base S by the cutting part 12, to the collecting part 18.

As shown in FIGS. 1–3, the transport part 14 is composed of a conveyor belt 46 (which will be referred to as "the first conveyer 46"). The first conveyer 46 is provided below the wafer W attached to the setting unit 22 of the cutting part 12, and it runs in a direction in which the wafer W is attached. The wafer W, which has been cut off from the slice base S, falls onto the first conveyer 46 and it is transported to the collecting part 18.

A belt for transportation is preferably made of an elastic material such as rubber in order to prevent the wafer W from breaking or chipping resulting from the shock of the fall.

A description will be given of the structure of the distinguishing part 16. The distinguishing part 16 images the wafer W, which is transported on the first conveyer 46 of the transport part 14, by a CCD camera 48, and image-processes the image data of the wafer W to recognize whether the wafer W is normal or not.

As shown in FIG. 1, the CCD camera 48 is supported by a frame (not illustrated), and it is placed above the first conveyer 46. The CCD camera 48 images the wafer W that is transported on the first conveyer 46, and outputs the image data of the wafer W to a control unit 50.

The control unit 50 image-processes the image data that is output from the CCD camera 48, and recognizes whether the wafer W is normal or not. Specifically, the control unit 50 checks whether the wafer W is broken or chipping, and distinguishes the inferior wafers W from the normal wafers W.

A description will be given of the structure of the collecting part 18. As stated previously, the collecting part 18 collects the wafers W, which have been cut off from the slice base S by the cutting part 12. In this case, the collecting part 18 collects the normal wafers separately from the inferior wafers in accordance with the recognition results of the distinguishing part 16.

Figure 4:
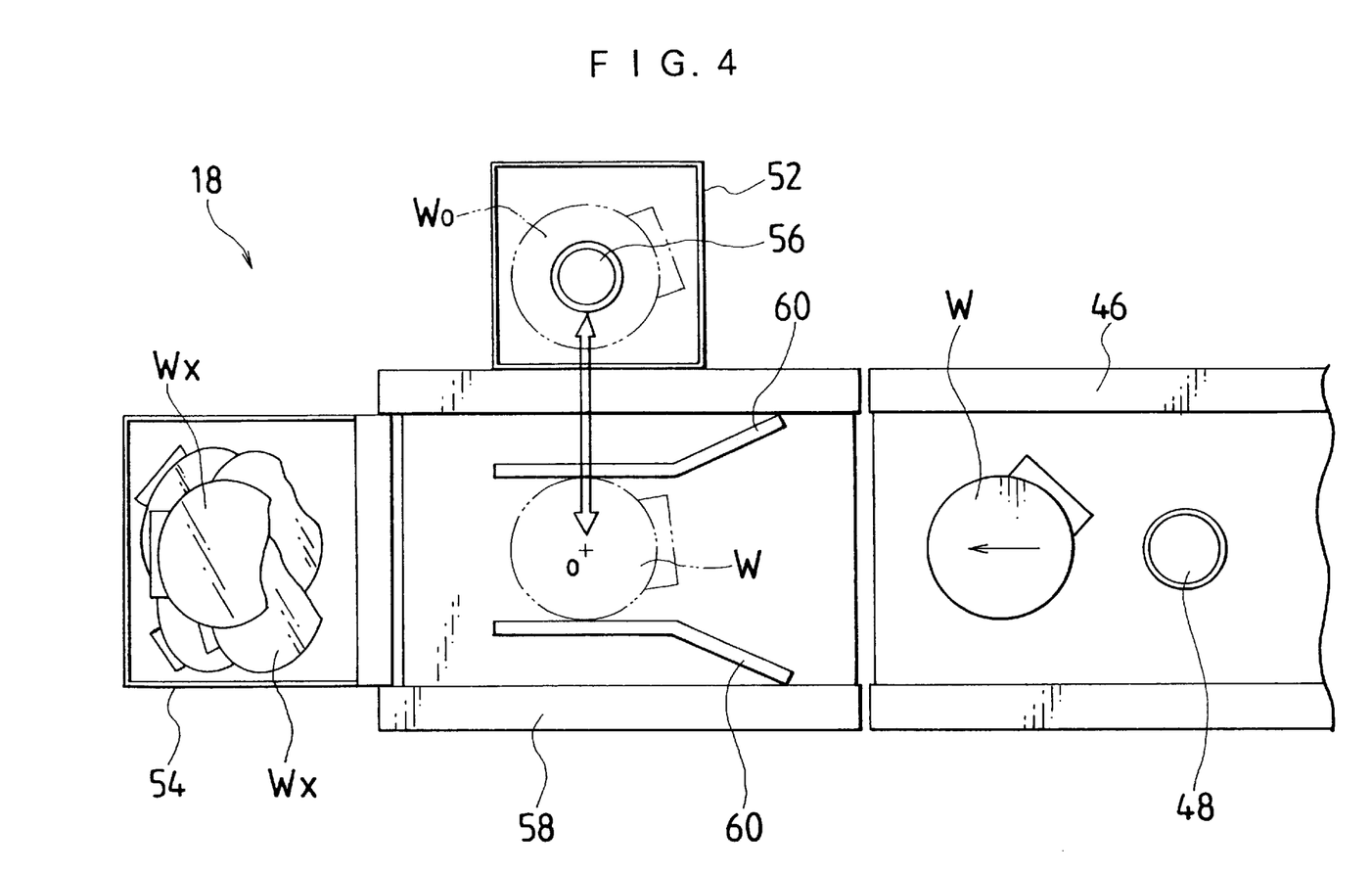
FIG. 4 is a front view illustrating the structure of a collecting part.

As shown in FIGS. 1 and 4, the collecting part 18 is provided with a wafer-collecting cassette 52 in that the normal wafers $W_O$ are collected; an inferior wafer-collecting cassette 54 in that the inferior wafers $W_X$ are collected; a transfer pad 56 that transfers the normal wafers $W_O$ to the wafer-collecting cassette 52; and a conveyor belt 58 that transports the inferior wafers $W_X$ to the inferior wafer-collecting cassette 54 (the conveyor belt 58 will be referred to as "the second conveyer 58").

The second conveyer 58 connects to the rear end of the first conveyer 46, and the inferior wafer collecting cassette 54 is provided at the rear end of the second conveyer 58. A pair of guide members 60 is provided on the second conveyer 58, and the pair of guide members 60 guides the wafer W, which have been transported on the first conveyer 46, to the central part of the belt. The wafer W, which is transported on the second conveyer 58, is guided to the central part of the belt by the guide members 60, and the wafer W is transported to a predetermined delivering position on the belt.

The wafer-collecting cassette 52 is arranged at the side of the second conveyer 58.

The transfer pad 56 holds the wafer W by vacuum, and transfers the wafer W from the delivering position to the wafer-collecting cassette 52. A moving means (not illustrated) enables the transfer pad 56 to move back and forth between the wafer-collecting cassette 52 and the delivering position O. A lifting means (not illustrated) enables the transfer pad 56 to go up and down.

The control unit 50 controls the driving of the transfer pad 56 and the second conveyer 58. Specifically, the driving of the transfer pad 56 and the second conveyer 58 is controlled in accordance with the recognition results of the distinguishing part 16 so that the normal wafers $W_O$ and the inferior wafers $W_X$ are collected in the wafer-collecting cassette 54 and the inferior wafer-collecting cassette 54, respectively.

Suppose that the wafer $W_O$, which was judged as being normal by the distinguishing part 16, is transported on the first conveyer 46. First, the control unit 50 outputs a drive signal to the second conveyer 58, so that the normal wafer $W_O$ can be transported to the delivering position O. When the wafer $W_O$ reaches the receiving position O, the control unit 50 stops driving the second conveyer 58. Then, the control unit 50 drives the transfer pad 56, so that the wafer $W_O$ can be transferred from the delivering position O to the wafer-collecting cassette 52.

On the other hand, if the wafer $W_X$, which was judged as being inferior, is transported on the first conveyer 46, the control part 50 drives the second conveyer 58 so that the wafer $W_X$ can be transported to the inferior wafer-collecting cassette 54.

A description will be given of the operation of the wafer-collecting apparatus 10, which is constructed in the above-mentioned manner.

First, a number of wafers W, which were sliced by the slicing machine such as the wire saw at the same time, are transported to the wafer collecting apparatus 10 in a state of being mounted on the mounting plate M. Then, the mounting plate M is fixed to the setting unit 22 of the cutting part 12. Then, the wafer collecting apparatus 10 is activated.

When the wafer collecting apparatus 10 starts working, the motors 40 are run so that the bonded abrasive wire 44 can start running. At the same time, the first conveyer 46 is driven to start running.

When the motors 40 start running the bonded abrasive wire 44, the feed apparatus 32 of the bonded abrasive wire 44 is driven. Therefore, the running bonded abrasive wire 44 moves toward the slice base S. The running bonded abrasive wire 44 is pressed against the slice base S, and the slice base S is cut to cause the wafer W to be cut off from the slice base S.

The wafer W, which has been cut off from the slice base S, falls onto the transport belt of the running first conveyer 46. The wafer W is transported on the first conveyer 46 to the collecting part 18. The CCD camera 48 of the distinguishing part 16 images the wafer W, which is being transported on the first conveyer 46, and the image data of the wafer W is output to the control unit 50.

The control unit 50 image-processes the image data, which is output from the CCD camera 48, and distinguishes between the normal wafers $W_O$ or the inferior wafers $W_X$. In accordance with the recognition results, the control unit 50 controls the transfer pad 56 and the second conveyer 58 as described below.

If the wafer W is judged as being the normal wafer $W_O$, the control unit 50 outputs the drive signal to the second conveyer 58, so that the normal wafer $W_O$, which has been transported on the first conveyer 46, can be transported to the delivering position O. The control unit 50 outputs the drive signal to the transfer pad 56, so that the normal wafer $W_O$ can be transported from the delivering position O to the wafer-collecting cassette 52.

On the other hand, if the wafer W is judged as being the inferior wafer $W_X$, the second conveyer 58 is driven so that the inferior wafer $W_X$, which has been transported on the first conveyer 46, can be transported to the inferior wafer-collecting 54.

The wafers W, which are attached to the setting unit 22 of the cutting part 12, are cut by the running bonded abrasive wire 44 one by one, and thus, the wafer collecting apparatus 10 sequentially collects the wafers W one by one.

As stated above, the wafer collecting apparatus of this embodiment automatically separates the simultaneously-sliced batch wafers W into individual wafers, and collects the normal wafers and the inferior wafers separately.

Moreover, the wafer collecting apparatus of the present invention is advantageous because it can find the break or chip of not only the wafer at the end but also the wafers positioned halfway (the wafers are broken or chipping during the cutting process and the transport process), and collects them as the inferior wafers. Although it is possible to easily find the break or chip of the wafer positioned at the end, it is difficult to find the break or chip of the other wafers. The wafer collecting apparatus of the present invention automatically finds the break or chip of the inferior wafers and collects them separately from the normal wafers in advance. This eliminates the necessity of distinguishing between the normal wafers and the inferior wafers after the wafer W is separated from the slice base S, thereby improving the processing efficiency.

In this embodiment, the endless bonded abrasive wire runs to cut the slice base S, but the present invention is not restricted to this. For example, a bonded abrasive wire is supplied from one wire reel and is taken up by the other reel. The bonded abrasive wire runs between the pair of wire reels to cut the slice base S.

In addition, the slice base S may also be cut by a saw, which moves back and forth, or a disc cutter.

In this embodiment, the normal wafers and the inferior wafers are collected in the different collecting cassettes, but they may also be collected as described below. After the wafers are separated from the slice base S, they are collected in one collecting cassette in an order in which they are separated from the slice base S. Later, an operator may pull out the wafers, which were judged as being inferior by the distinguishing part 16. In this case, the operator knows which wafers should be pulled out, and pulls out the individual wafers. Thus, the wafers can be collected easily and quickly.

The collecting part 18 is not restricted to the one described in this embodiment. For example, a vacuum pad for transportation collects the wafers, which have been transported on the first conveyer 46, in the wafer-collecting cassette 52 and the inferior wafer-collecting cassette 54.

In this embodiment, the collecting part 18 collects the normal wafers $W_O$ in the wafer-collecting cassette 52, but the wafers can also be collected in a manner described below. The collecting part 18 is provided with a conveyer that transports the wafers, which are judged as being normal, to the next step (e.g., a cleaning step). Thus, the wafers can be treated continuously, which improves the wafer processing efficiency.

The collecting part 18 may also be constructed in a manner described below in order to improve the efficiency of the wafer manufacturing process as a whole and the quality of the manufactured wafers. The collecting part 18 is provided with a measuring part, which measures the thickness of the wafer W collected in the wafer-collecting cassette 52. It is therefore possible to confirm the condition of the slicing machine that has already sliced the ingot. The slicing conditions, etc. are corrected in accordance with the measurement results, and this makes it possible to slice the ingot into wavers more accurately when the next ingot is sliced. Since the measuring part measures the thickness of the wafer which has just been sliced, the condition of the slicing machine can be recognized accurately.

In a wafer chamfering process, etc. in the post-treatment, the measurement data on the thickness of the wafer is provided to stabilize the chamfering accuracy, etc.

As set forth hereinabove, the wafer collecting apparatus of the present invention is able to automatically collect a number of wafers, which have been sliced at the same time, one by one from the slice base which holds them. In addition, the wafer collecting apparatus is able to automatically recognize whether the collected wafers are normal or inferior.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer collecting apparatus which collects a number of wafers, having been sliced from an ingot at the same time by a slicing machine, from a slice base holding the wafers, said wafer collecting apparatus comprising:

holding means for holding a slice base with the wafers at the lower side thereof;

a carriage which runs along said slice base held by said holding means;

cutting means provided at said carriage to cut said slice base as said carriage runs, and to cut off the wafers one by one from said slice base;

transport means provided below said holding means for receiving the wafer, which is cut off from said slice base and falls onto said transport means, and transporting the received wafer;

imaging means for imaging the shape of the wafer transported by said transport means;

distinguishing means for distinguishing between normal wafers and inferior wafers in accordance with the imaging results of said imaging means; and collecting part for collecting the wafers transported by said transport means.

2. The wafer collecting apparatus as defined in claim 1, further comprises measuring means for measuring the thickness of the collected wafer.

3. The wafer collecting apparatus as defined in claim 1, wherein said transport means is a conveyor belt whose transport belt is made of elastic material.

4. The wafer collecting apparatus as defined in claim 1, wherein said cutting means cuts said slice base by running a wire to which bonded abrasives are adhered.

5. The wafer collecting apparatus as defined in claim 1, wherein said cutting means cuts said slice base by moving a saw back and forth.

6. The wafer collecting apparatus as defined in claim 1, wherein said cutting means cuts said slice base by rotating a disc cutter.

7. A wafer collecting apparatus which collects a number of wafers, having been sliced from an ingot at the same time by a slicing machine, from a slice base holding the wafers, said wafer collecting apparatus comprising:

holding means for holding a slice base with the wafers at the lower side thereof;

a carriage which runs along said slice base held by said holding means;

cutting means provided at said carriage to cut said slice base as said carriage runs, said cutting means cutting off the wafers one by one from said slice base;

transport means provided below said holding means for receiving the wafer, which is cut off from said slice base and falls onto said transport means, and transporting the received wafer;

imaging means for imaging the shape of the wafer transported by said transport means;

distinguishing means for distinguishing between normal wafers and inferior wafers in accordance with the imaging results of said imaging means;

a first cassette in which the normal wafers are collected;

a second cassette in which the inferior wafers are collected;

first transfer means for transferring the wafer, transported by said transport means, into said first cassette;

second transfer means for transferring the wafer, transported by said transport means, into said second cassette; and control means for controlling said first transfer means and said second transfer means in accordance with the recognition results of said distinguishing means such that the normal wafers and the inferior wafers are collected in said first cassette and said second cassette, respectively.

8. The wafer collecting apparatus as defined in claim 7, further comprising measuring means for measuring the thickness of the collected wafer.

9. The wafer collecting apparatus as defined in claim 7, wherein said transport means is a conveyor belt whose transport belt is made of elastic material.

10. The wafer collecting apparatus as defined in claim 7, wherein said cutting means cuts said slice base by running a wire to which bonded abrasives are adhered.

11. The wafer collecting apparatus as defined in claim 7, wherein said cutting means cuts said slice base by moving a saw back and forth.

12. The wafer collecting apparatus as defined in claim 7 wherein said cutting means cuts said slice base by rotating a disc cutter.

13. A wafer collecting apparatus which collects a number of wafers, having been sliced from an ingot at the same time by a slicing machine, from a slice base holding the wafers, said wafer collecting apparatus comprising:

holding means for holding a slice base with the wafers at the lower side thereof;

a carriage which runs along said slice base held by said holding means;

cutting means provided at said carriage to cut said slice base as said carriage runs, and to cut off the wafers one by one from said slice base;

transport means provided below said holding means for receiving the wafer, which is cut off from said slice base and falls onto said transport means, and transporting the received wafer;

imaging means for imaging the shape of the wafer transported by said transport means;

distinguishing means for distinguishing between normal wafers and inferior wafers in accordance with the imaging results of said imaging means;

second transport means for transporting the normal wafers to the next step;

a cassette in which the inferior wafers are collected;

first transfer means for transferring the wafers, transported by said transport means, to said second transport means;

second transfer means for transferring the wafers, transported by said transport means, into said cassette; and control means for controlling said first transfer means and said second transfer means in accordance with the recognition results of said distinguishing means such that the normal wafers are transferred to said second transport means and the inferior wafers are collected in said second cassette.

14. The wafer collecting apparatus as defined in claim 13, further comprising measuring means for measuring the thickness of the collected wafer.

15. The wafer collecting apparatus as defined in claim 13, wherein said transport means is a conveyor belt whose transport belt is made of elastic material.

16. The wafer collecting apparatus as defined in claim 13, wherein said cutting means cuts said slice base by running a wire to which bonded abrasives are adhered.

17. The wafer collecting apparatus as defined in claim 13, wherein said cutting means cuts said slice base by moving a saw back and forth.

18. The wafer collecting apparatus as defined in claim 13 wherein said cutting means cuts said slice base by rotating a disc cutter.

* * * * *